United States Patent
Chen et al.

(10) Patent No.: US 6,940,135 B2
(45) Date of Patent: Sep. 6, 2005

(54) MASK-ROM PROCESS AND DEVICE TO PREVENT PUNCH THROUGH USING A HALO IMPLANT PROCESS

(75) Inventors: Guoqing Chen, Shanghai (CN); Roger Lee, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 10/391,537

(22) Filed: Mar. 17, 2003

(65) Prior Publication Data

US 2004/0126974 A1 Jul. 1, 2004

(51) Int. Cl.[7] .......................................... H01L 21/8246
(52) U.S. Cl. ....................................... 257/391; 438/275
(58) Field of Search ................................ 257/390–393, 257/497–498; 438/275–279

(56) References Cited

U.S. PATENT DOCUMENTS 4,649,629 A * 3/1987 Miller et al. ................ 438/130
5,780,344 A * 7/1998 Hasegawa ................... 438/275
6,201,282 B1 * 3/2001 Eitan .......................... 257/390

* cited by examiner

Primary Examiner—H. Jey Tsai
(74) Attorney, Agent, or Firm—Townsend and Townsend and Crew, LLP

(57) ABSTRACT

A method and device for manufacturing a mask ROM integrated circuit device to reduce influences of punch through between source and channel regions that output improper program readings. The method includes forming well regions using an implant process on semiconductor substrate and forming a plurality of buried implant regions through first patterned mask. The first patterned mask is formed overlying the semiconductor substrate. Each of the buried implant regions includes a source region and a drain region for each respective memory cell region. The memory cell region is one of a plurality of memory cell regions. The method also forms pocket regions adjacent to a vicinity of each of the buried implant regions within the channel region for each of the memory cell regions. A first pocket region is defined between the channel region and source region and a second pocket region is defined between the channel region and the drain region for each memory cell region. The method includes programming one or more selected channel regions using implantation to program respective one or more selected memory cell regions.

18 Claims, 7 Drawing Sheets

MASK-ROM PROCESS AND DEVICE TO PREVENT PUNCH THROUGH USING A HALO IMPLANT PROCESS

CROSS-REFERENCES TO RELATED APPLICATIONS

This application claims priority from a Republic of China application entitled AN IMPROVED MASK-ROM PROCESS AND DEVICE TO PREVENT PUNCH THROUGH USING A HALO IMPLANT PROCESS filed Dec. 27, 2002 and assigned R.O.C. Application No. 02160506.8, the disclosure of which is hereby incorporated in its entirety for all purposes.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER

PROGRAM LISTING APPENDIX SUBMITTED ON A COMPACT DISK

Not Applicable

BACKGROUND OF THE INVENTION

The present invention is about one kind of integrated circuits and its manufacturing processes. More particularly, the invention provides a method for manufacturing a mask read only memory ("ROM") having reduced critical size features that are substantially free from undesirable punch through effects. But it would be recognized that the invention has a much broader range of applicability. For example, the invention can be applied to embedded ROM designs and others.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed.

Many types of integrated circuit devices including memory devices, application specific integrated circuit devices, microprocessor device, and others exist. Memory devices include read only memories such as ROMs. ROMs include mask ROMs and field oxidation ROMs. As device sizes become smaller, various limitations exist with mask ROMs. For example, mask ROMs have a punch through problem, where a cell improperly provides an incorrect state of the cell upon a reading operation. That is, the cell outputs a "1" rather than "0" state, which yields an improper output. As device sizes become smaller, such problem becomes worse. A threshold voltage of the cell drops and causes improper reading of the cell. These and other limitations exist with conventional ROM integrated circuit devices.

From the above, it is seen that an improved technique for processing semiconductor devices is desired.

BRIEF SUMMARY OF THE INVENTION

According to the present invention, techniques including methods for the manufacture of semiconductor devices are provided. More particularly, the invention provides a method for manufacturing a mask read only memory ("ROM") having reduced critical size features that are substantially free from undesirable punch through effects. But it would be recognized that the invention has a much broader range of applicability. For example, the invention can be applied to embedded ROM designs and others.

In a specific embodiment, the invention provides a method for manufacturing a mask ROM integrated circuit device to reduce influences of punch through between source and drain regions that output improper program readings. The method includes forming well regions using an implant process on semiconductor substrate and forming a plurality of buried implant regions through first patterned mask. The first patterned mask is formed overlying the semiconductor substrate. Each of the buried implant regions includes a source region and a drain region for each respective memory cell region. The memory cell region is one of a plurality of memory cell regions. The method also forms pocket regions adjacent to a vicinity of each of the buried implant regions within the channel region for each of the memory cell regions. A first pocket region is defined between the channel region and source region. A second pocket region is defined between the channel region and the drain region for each memory cell region. The method includes programming one or more selected channel regions using implantation to program respective one or more selected memory cell regions.

In an alternative specific embodiment, the invention provides a method for manufacturing integrated circuit devices including a design method for reducing a critical dimension from about 0.35 micron to below 0.35 micron to reduce influences of punch through effects that lead to improper program readings of mask read only memory devices. The design method includes arranging well regions using an implant process on semiconductor substrate and arranging a plurality of buried implant regions through first patterned mask regions to define a source and a drain region between a channel region for each memory cell region. The method also arranges a pocket region(s) adjacent to a vicinity of each of the buried implant regions within the channel region for each of the memory cell regions. The pocket region(s) is of a characteristic of an opposite impurity characteristic of the buried implant regions. The method programs one or more selected channel regions of respective one or more memory cell regions to program the respective one or more memory cell regions. The pocket region is provided to reduce punch through influence between one or more of the source and drain regions in the channel region for respective one or more memory cell regions.

In an alternative specific embodiment, the invention provides a mask ROM integrated circuit device. The device includes a semiconductor substrate, a well region formed on the semiconductor substrate, and a source region coupled to a drain region, which are of a first impurity characteristic. A channel region is defined between the source region and the drain region. A first pocket region is defined between the channel region and the source region. A second pocket region is defined between the channel region and the drain region. A word line is defined overlying the channel region. The device has an interlayer dielectric layer overlying the word line and a metal interconnect layer overlying the interlayer dielectric layer. The first pocket region and the second pocket region are of a second impurity characteristic, which is of a counter type of the first impurity characteristic. The first pocket region and the second pocket region maintain the source region from interfering with the drain region when a voltage less than a threshold voltage has been applied.

Many benefits are achieved by way of the present invention over conventional techniques. For example, the present technique provides an easy way to use process that relies upon conventional technology. In some embodiments, the method provides higher device yields in dies per wafer. Additionally, the method provides a process that is compatible with conventional process technology without substantial modifications to conventional equipment and processes. The present invention also provides for an improved mask ROM that does not include limitations of conventional devices. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques including methods for the manufacture of semiconductor devices are provided. More particularly, the invention provides a method for manufacturing a mask read only memory ("ROM") having reduced critical size features that are substantially free from undesirable punch through effects. But it would be recognized that the invention has a much broader range of applicability. For example, the invention can be applied to embedded ROM designs and others.

Figure 1:
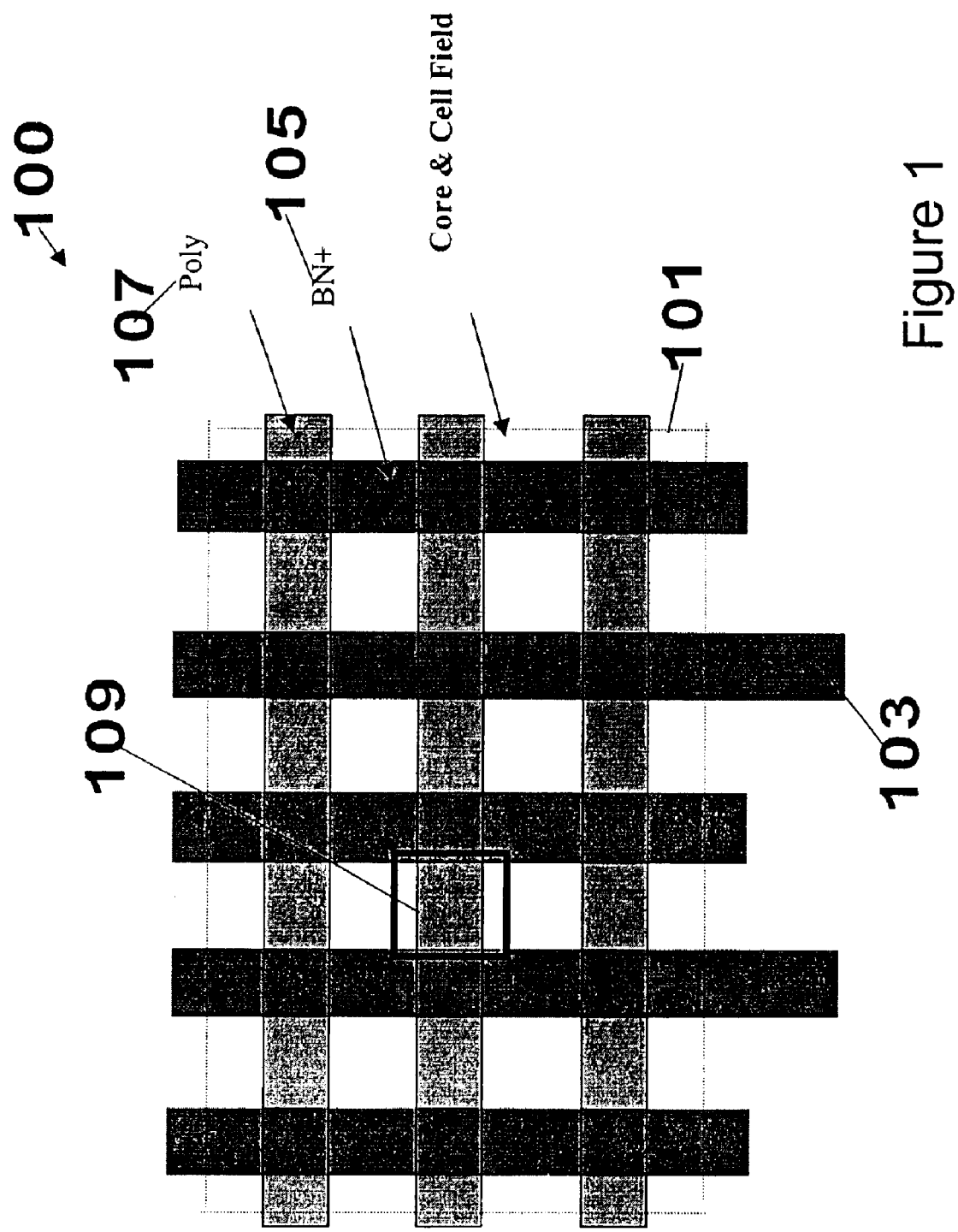
FIG. 1 is a simplified top-view diagram of a mask ROM cell layout according to an embodiment of the present invention.

FIG. 1 is a simplified top-view diagram 100 of a mask ROM cell layout according to an embodiment of the present invention. This diagram is merely an example, which should not unduly limit the scope of the claims herein. One of ordinary skill in the art would recognize many other variations, modifications, and alternatives. As shown, the top-view diagram includes a plurality of polysilicon conductors 107, each defining a word line for an array of memory cells 101. A source/drain or active regions 105 are also shown. The active regions including buried region, which has a higher concentration of impurities. As merely an example, the buried region includes N+ type impurities such as boron bearing species and others. A channel implant 109 is also shown. Such channel implant provides programming of selected memory cells. A programmed memory cell yields a logic state such as "1" for example. Alternatively, a non-programmed cell yields a "0" as an example. Further details of the present invention are provided throughout the present specification and more particularly below.

Figure 2:
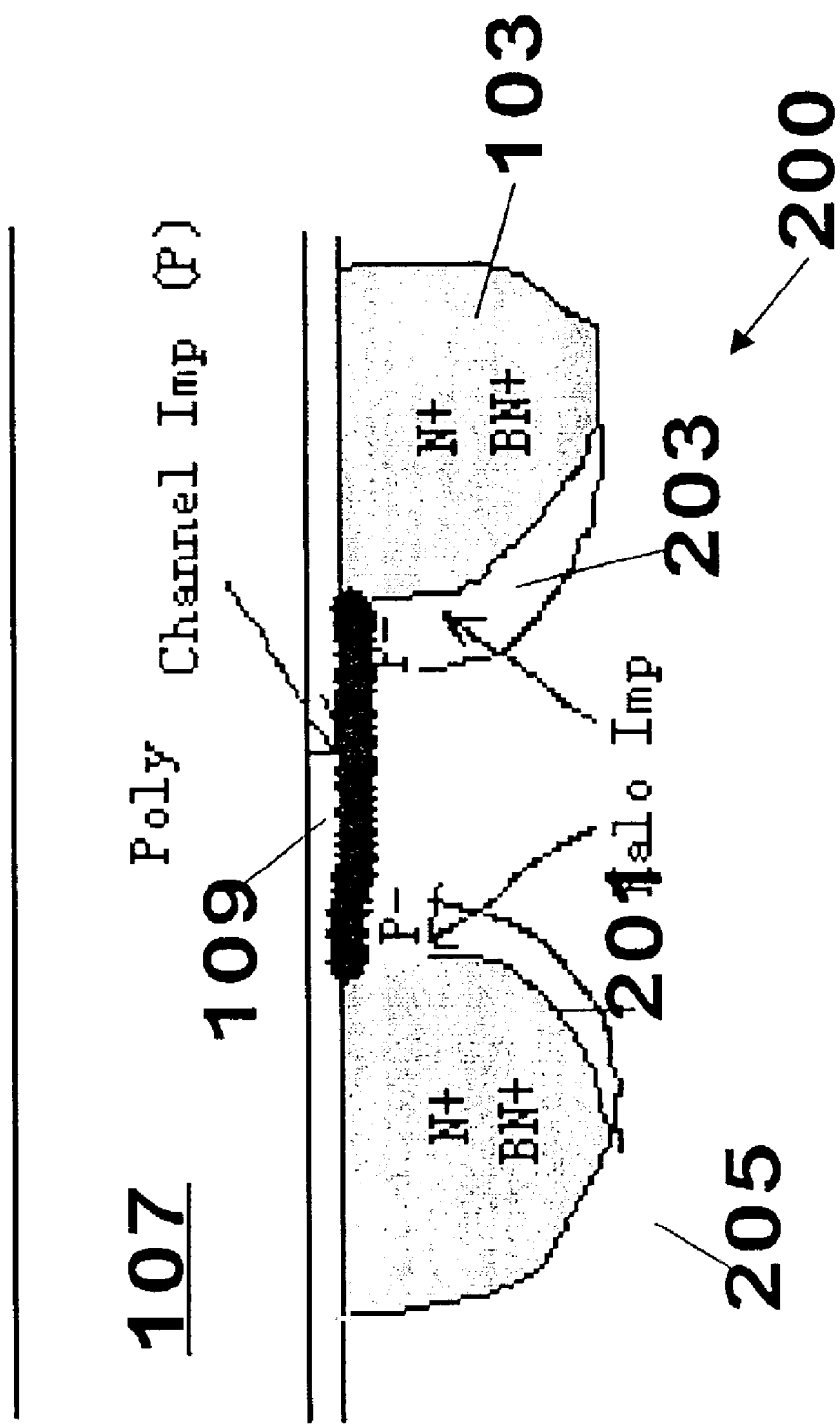
FIG. 2 is a simplified cross-sectional view of a mask ROM according to an embodiment of the present invention.

FIG. 2 is a simplified cross-sectional view of a mask ROM 200 according to an embodiment of the present invention. This diagram is merely an example, which should not unduly limit the scope of the claims herein. One of ordinary skill in the art would recognize many other variations, modifications, and alternatives. Additionally, certain reference numerals are like as certain other FIGUREs provided for cross-referencing purposes. The cross-section 200 is for a single memory cell, which is provided in the array. The memory cell includes substrate 205, which includes well region. The substrate is often of P-type impurity but can be others. The well region is also of P-type impurity. The polysilicon layer 107 is formed overlying a surface of the substrate. Source/drain regions 103 are also shown. A pocket region 203 is formed between the buried region and the channel region, which includes channel implant in the present example. Another pocket region 201 is formed between buried region and channel region. Each of the pocket regions interfaces between the channel region and respective buried regions to prevent a possibility of punch through between source and drain region.

In a specific embodiment, various parameters are provided. The pocket region is substantially a P-type impurity, which is selectively provided using a "halo" implant. The halo implant uses boron bearing species or boron fluorine bearing species or the like. The implant is often provided using a dose ranging from about 5×1011 to about 5×1013 atoms/cm2, but can also be at other doses. Energy is often provided ranging from about 25 keV to about 100 keV, but can also be others. Often times, angle-implanting processes are used for the halo implant. Alternatively, other suitable techniques may be used, depending upon the application.

Figure 3:
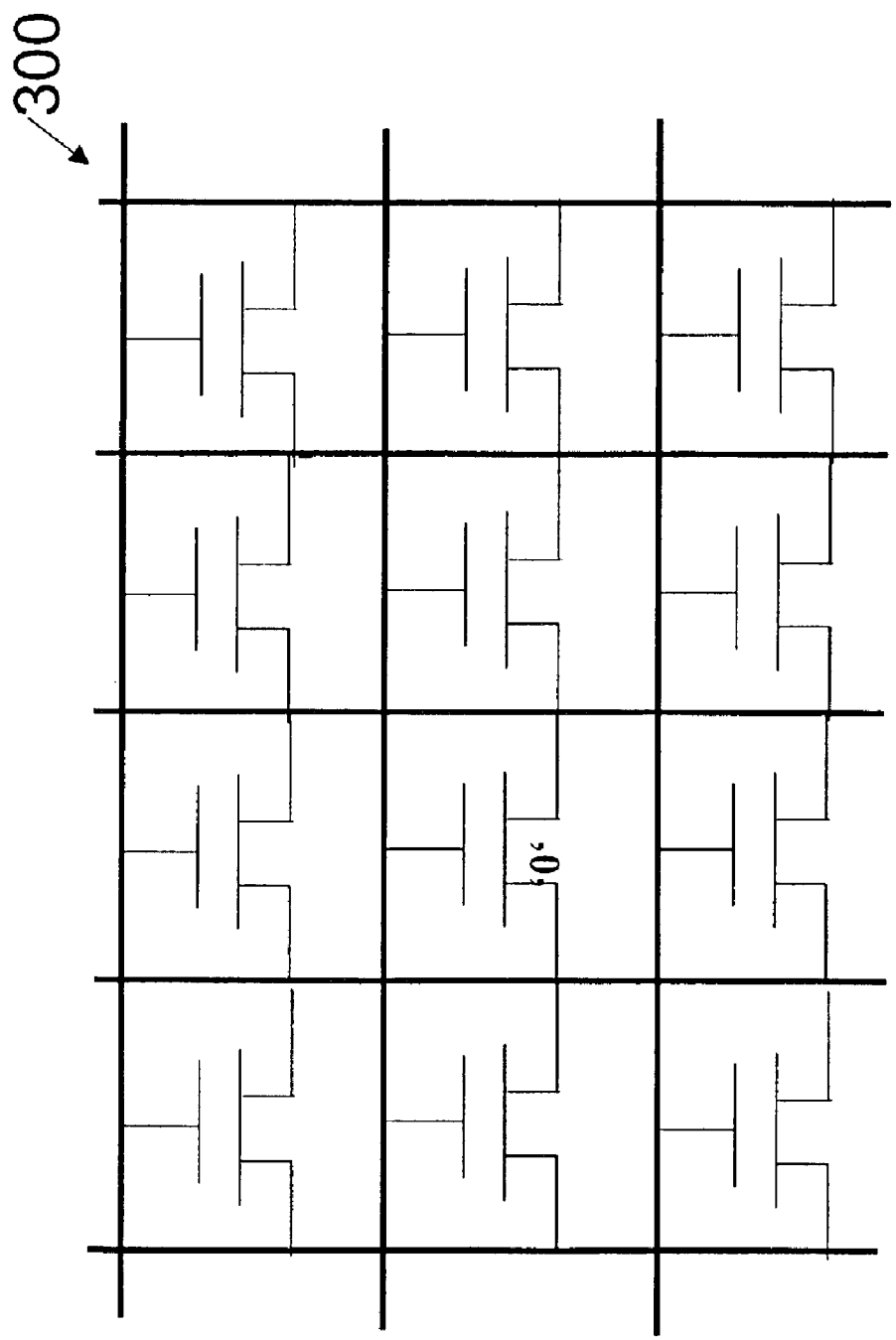
FIG. 3 is a simplified cell circuit diagram of a mask ROM according to an embodiment of the present invention.
Figure 4:
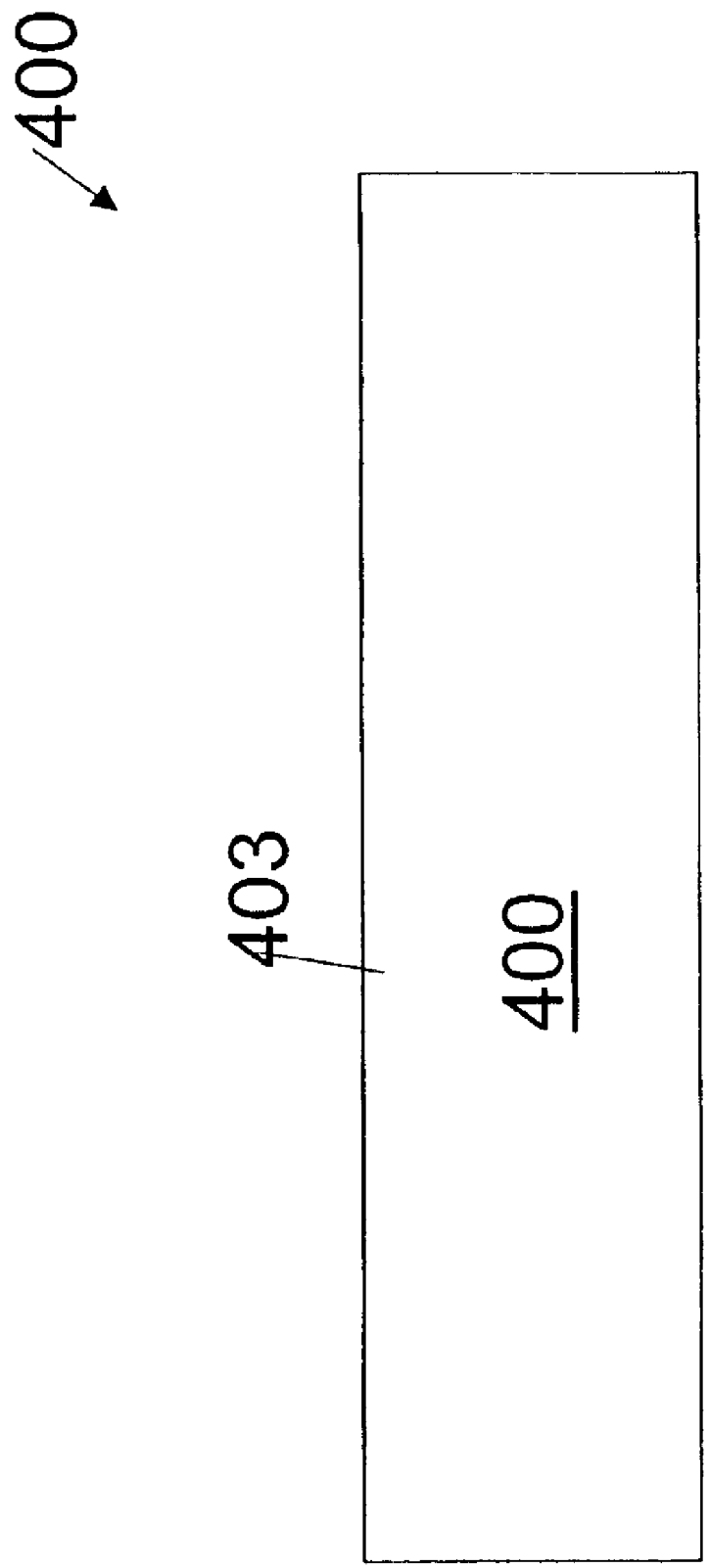
FIGS. 4 through 7 illustrate methods of fabricating a mask ROM according to embodiments of the present invention

FIG. 3 is a simplified cell circuit diagram 300 of a mask ROM according to an embodiment of the present invention. This diagram is merely an example, which should not unduly limit the scope of the claims herein. One of ordinary skill in the art would recognize many other variations, modifications, and alternatives. The diagram includes a plurality of cells. Each of the cells including a transistor device, which stores a 1 or 0 by way of implantation. Each of the cells is coupled to a word line and a bit line, which couples to sense amplifiers. The buried implant region defines the bit line structure. Further details of the present invention may be provided using the following methods.

A method according to an embodiment of the present invention may be outlined as follows:

1. Provide substrate;
2. Form well implant;
3. Form buried N+ implant;
4. Form counter doping implant in pocket region to define source regions;
5. Form code implant to selected channel regions of the memory array;

6. Form word line poly layer overlying substrate;
7. Pattern word line poly layer;
8. Form interlayer dielectric layer;
9. Form contact regions;
10. Form metal line;
11. Form passivation layer overlying the metal layer; and
12. Perform other steps, as desired.

The above sequence of steps provides a method according to an embodiment of the present invention. The present method uses a counter doping implant in pocket regions to prevent an influence of punch through between source and drain regions in the channel region. Such punch through causes improper program readings as well as other limitations. These and other steps are described throughout the present specification and more particularly below.

FIGS. 4 through 7 illustrate methods of fabricating a mask ROM according to embodiments of the present invention. These diagrams are merely examples, which should not unduly limit the scope of the claims herein. One of ordinary skill in the art would recognize many other variations, modifications, and alternatives. The present method begins by providing a substrate 401, which has upper surface 403. The substrate can be a semiconductor substrate such as a silicon wafer and the like. The silicon substrate is often P-type and has a concentration of about $10^{14}$–$10^{16}$ atom/cm$^3$, but can be others.

Figure 5:
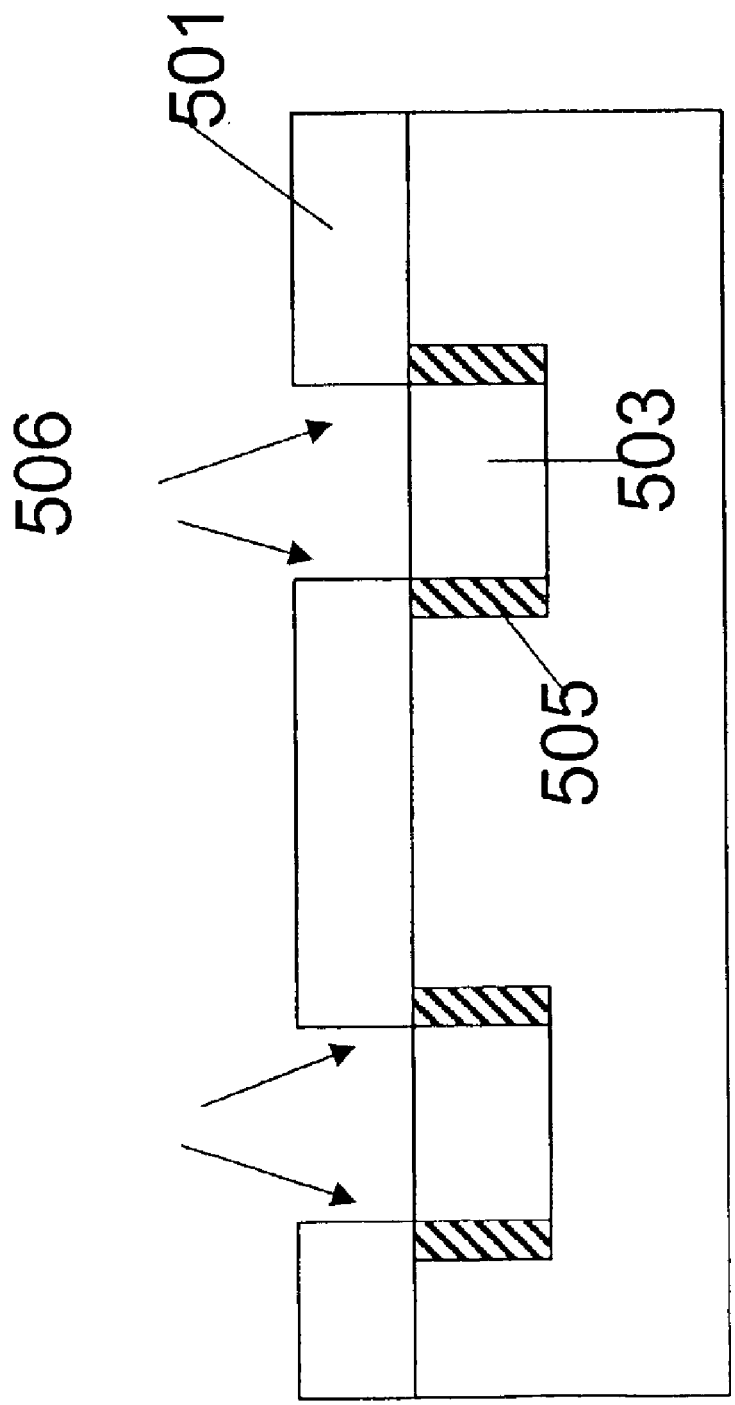
Figure 6:
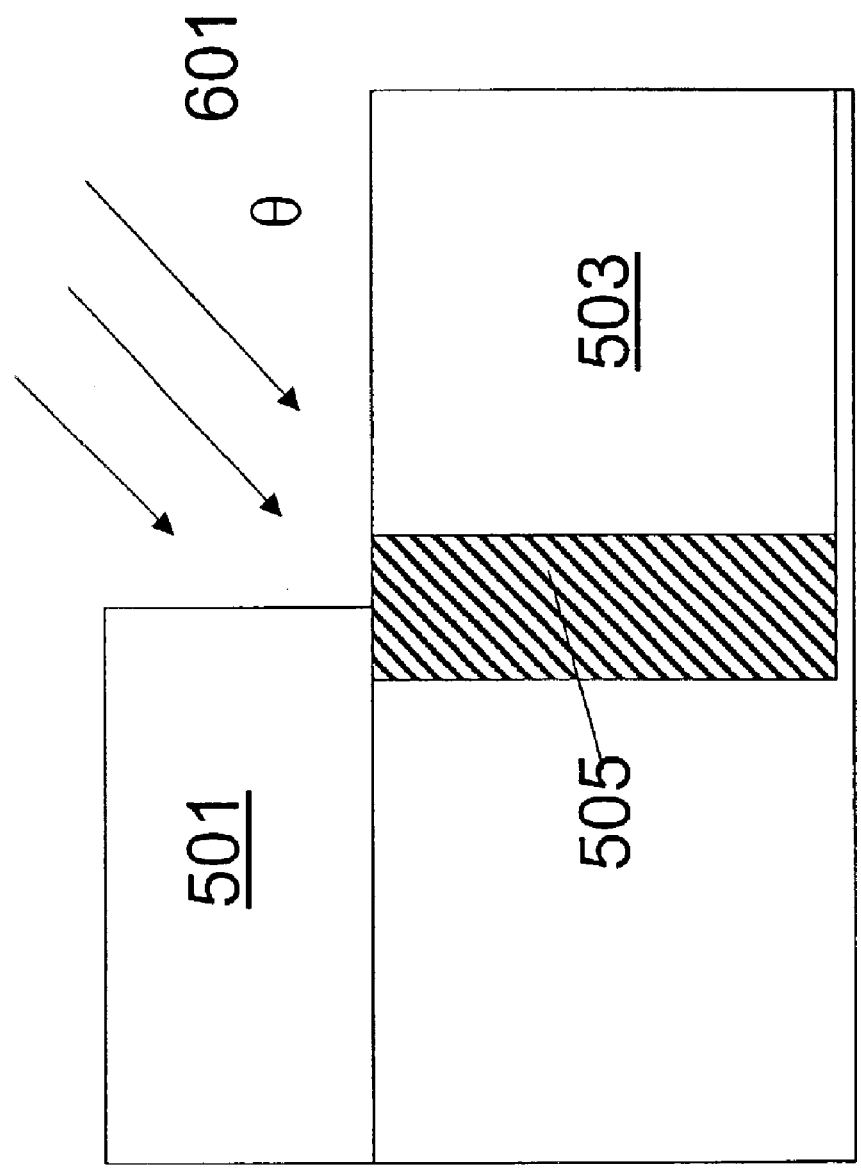
Figure 7:
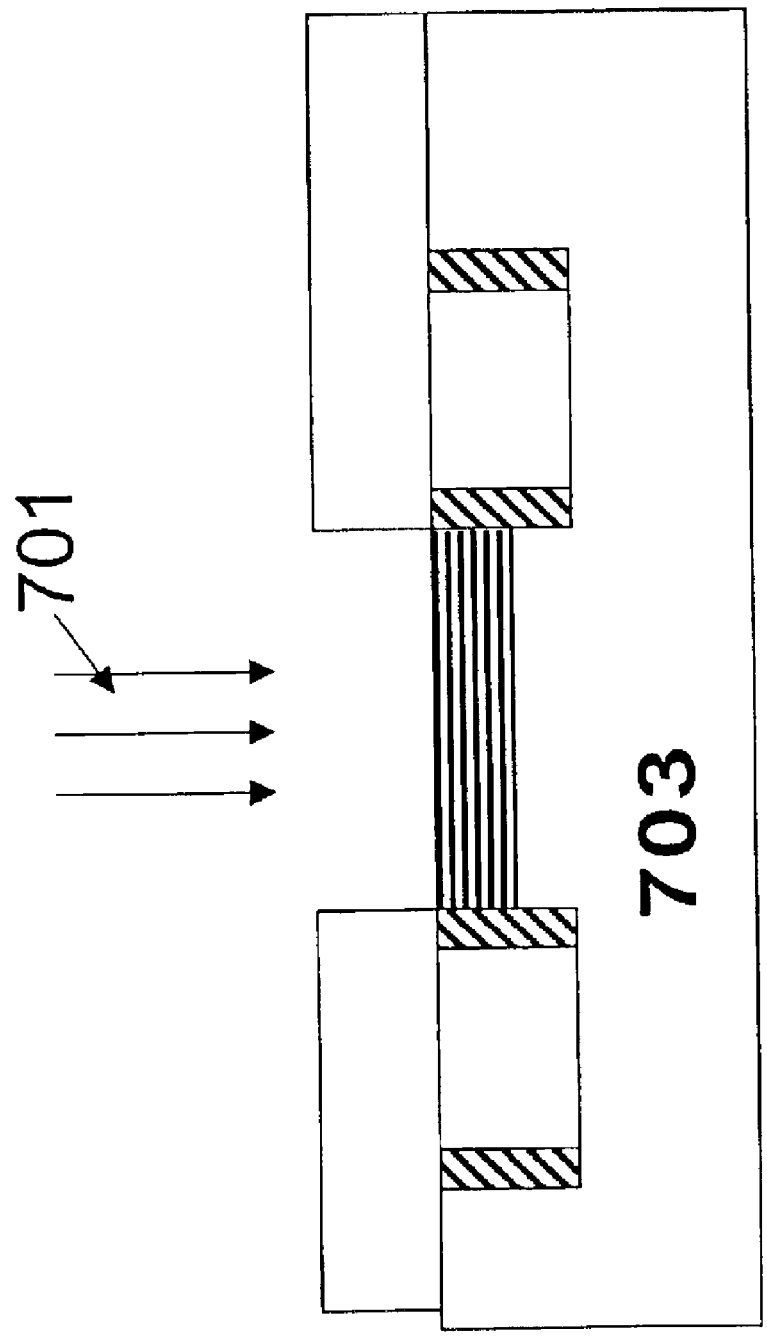

Referring to FIG. 5, masking layer is formed 501 overlying the upper surface 403. The masking layer is patterned using conventional photolithography techniques. The method includes implanting buried region 503, which forms the bit line structure. The implantation uses boron bearing species or boron fluorine bearing species or other species. The buried layer is often 0.01–0.10 microns deep for a channel region. An angle implanting process 506 forms pocket regions 505. Angle implanting occurs using an angle 601 ranging from about 10 degrees to about 30, but can be others. Pocket region 505 forms a P-type impurity profile in the substrate. Such impurity profile prevents a possibility of punch through between buried implant regions. The pocket region is formed during the same masking step as the buried region for efficiency purposes.

The method performs a step of programming selected cell regions to program the array of memory devices. Here, masking covers selected cell regions. Other regions are maintained without masking. Such unmasked regions are implanted using impurities 701 to code 703 the memory cell, as shown in the simplified diagram of FIG. 7. Implanted region 703 allows the source region to connect to the drain region, which allows the signal to pass between each of the regions. The method forms a word line poly layer overlying selected regions of the substrate. The polysilicon layer is patterned using conventional masking and etching techniques. An interlayer dielectric layer or layers is formed overlying the polysilicon layer. The method forms contact regions within the dielectric layer. Next, the method applies metal (e.g., aluminum) overlying the contact regions to form interconnections. A passivation layer often of oxide and an overlying nitride layer are formed overlying the interconnections. Depending upon the embodiment, the method performs other steps as desirable.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for manufacturing a mask ROM integrated circuit device to reduce influences of punch through between source and channel regions that output improper program readings, the method comprising:

forming well regions using an implant process on semiconductor substrate;

forming a first patterned mask overlying the semiconductor substrate;

forming a plurality of buried implant regions through the first patterned mask, the first patterned mask being formed overlying the semiconductor substrate, each of the buried implant regions including a source region and a drain region formed between a channel region for each respective memory cell region, the memory cell region being one of a plurality of memory cell regions;

forming pocket regions adjacent to a vicinity of each of the buried implant regions within the channel region for each of the memory cell regions, each of the pocket regions including a first pocket region defined between the channel region and source region and a second pocket region defined between the channel region and the drain region for each memory cell region; and programming one or more selected memory cell regions using implantation of respective one or more selected channel regions; and wherein the pocket regions are defined by a counter dopant relative to the buried implant regions during the same masking process as the buried implant regions;

wherein the buried implant regions comprise a buried bit line region; and forming a word line overlying the channel region of each of the memory cell region.

2. The method of claim 1 wherein the selected channel regions are provided by a single masking process.

3. The method of claim 1 wherein the pocket regions are provided using an implant process using a boron bearing species or a boron fluoride bearing species, the implant process having an implant angle of incident of about 20 degrees to about 30 degrees from horizontal relative to a surface of the substrate, the implant process including a dose of ranging from about 5E11 to 5E13 atoms/cm$^2$ and an energy of ranging from about 15 to 100 keV.

4. The method of claim 1 wherein each of the channel regions is about 0.30 micron and less.

5. The method of claim 1 wherein the pocket regions reduces an influence of punch through within the channel region between the source and drain region of the memory cell region.

6. The method of claim 1 wherein the well regions are characteristic of a p-type material.

7. The method of claim 1 wherein the substrate is of a p-type characteristic material.

8. The method of claim 1 wherein the buried implant regions are provided using a dose ranging from about 1E15 to about 2E15 atoms/cm$^2$ and an energy ranging from about 20 to 60 keV.

9. The method of claim 8 wherein the buried implant regions include phosphorous or arsenic bearing species.

10. A method for manufacturing integrated circuit devices including a design method for reducing a critical dimension from about 0.35 micron to below 0.35 micron to reduce influences of punch through effects that lead to improper program readings of mask read only memory devices, the design method comprising:

arranging well regions using an implant process on semiconductor substrate;

arranging a plurality of buried implant regions through first patterned mask regions to define a source and a drain region between a channel region for each memory cell region;

arranging pocket regions adjacent to a vicinity of each of the buried implant regions within the channel region for each of the memory cell regions, the pocket regions being of a characteristic of an opposite impurity characteristic of the buried implant regions;

programming one or more selected memory cell regions by selectively implant each of the respective channel region;

whereupon the pocket regions are provided to reduce punch through influence between one or more of the source and drain regions in the channel region for respective one or more memory cell regions; and wherein the pocket regions are defined by a counter dopant relative to the buried implant regions using the first patterned mask; and wherein the pocket regions are provided using an implant process using a boron bearing species or a boron fluoride bearing species, the implant process having an implant angle of incident of about 20 degrees to about 30 degrees from horizontal relative to a surface of the substrate, the implant process including a dose of ranging from about 5E11 to 5E13 atoms/cm2 and an energy of ranging from about 15 to 100 keV; and wherein the buried implant regions comprise a buried bit line region; and forming a word line overlying the channel regions.

11. The method of claim 10 wherein the selected channel regions are provided by a masking process.

12. The method of claim 10 wherein each of the channel regions is about 0.30 micron and less.

13. The method of claim 10 wherein the well regions are characteristic of a p-type material.

14. The method of claim 10 wherein the substrate is of a p-type characteristic material.

15. The method of claim 10 wherein the buried implant regions are provided using a dose ranging from about 1E15 to about 2E15 atoms/cm2 and an energy ranging from about 20 to 60 keV.

16. The method of claim 15 wherein the buried implant regions include phosphorous or arsenic bearing species.

17. A mask ROM integrated circuit device, the device comprising:

a semiconductor substrate;

a well region formed on the semiconductor substrate;

a source region including a first buried region coupled to a drain region including a second buried region, the source region and the drain region being of a first impurity characteristic;

a buried bit line formed by a portion of the first buried layer;

a channel region defined between the source region and the drain region;

a first pocket region defined between the channel region and the source region; and a second pocket region defined between the channel region and the drain region;

a word line defined overlying the channel region;

an interlayer dielectric layer overlying the word line; and a metal interconnect layer overlying the interlayer dielectric layer;

whereupon the first pocket region and the second pocket region are of a second impurity characteristic, the second impurity characteristic being of a counter type of the first impurity characteristic, the first pocket region and the second pocket region maintaining the source region from interfering with the drain region when a voltage less than a threshold voltage is applied to one of the buried regions.

18. The method of claim 1 wherein the first patterned mask is made of a photo resist material.

* * * * *